United States Patent
Cheong

(10) Patent No.: US 8,106,415 B2
(45) Date of Patent: Jan. 31, 2012

(54) SEMICONDUCTOR LIGHT EMITTING DEVICE

(75) Inventor: Hung Seob Cheong, Gwangju (KR)

(73) Assignee: LG Innotek Co., Ltd., Seoul (KR)

( * ) Notice: Subject to any disclaimer, the term of this patent is extended or adjusted under 35 U.S.C. 154(b) by 19 days.

(21) Appl. No.: 12/427,263

(22) Filed: Apr. 21, 2009

(65) Prior Publication Data

US 2009/0261318 A1    Oct. 22, 2009

(30) Foreign Application Priority Data

Apr. 22, 2008    (KR) ........................ 10-2008-0037444

(51) Int. Cl.
*H01L 33/20* (2010.01)
(52) U.S. Cl. ........... 257/98; 257/E33.067; 257/E33.068; 257/E33.074
(58) Field of Classification Search ............ 257/98, 257/E33.067, E33.068, E33.074
See application file for complete search history.

(56) References Cited

U.S. PATENT DOCUMENTS

| | | | |
|---|---|---|---|
| 7,244,957 B2 * | 7/2007 | Nakajo et al. | 257/13 |
| 2002/0115267 A1* | 8/2002 | Tomiya et al. | 438/478 |
| 2005/0189558 A1* | 9/2005 | Liu | 257/100 |
| 2006/0033113 A1* | 2/2006 | Lee et al. | 257/80 |
| 2007/0096123 A1* | 5/2007 | Utsumi et al. | 257/86 |
| 2008/0035953 A1* | 2/2008 | Beom et al. | 257/103 |

FOREIGN PATENT DOCUMENTS

| | | |
|---|---|---|
| JP | 2005-85932 A | 3/2005 |
| KR | 10-2008-0018355 A | 2/2006 |
| KR | 10-2007-0068061 A | 6/2007 |

* cited by examiner

*Primary Examiner* — Victor A Mandala
*Assistant Examiner* — Scott Stowe
(74) *Attorney, Agent, or Firm* — Birch, Stewart, Kolasch & Birch, LLP

(57) ABSTRACT

Embodiments provide a semiconductor light emitting device which comprises a first conductive semiconductor layer, an active layer on the first conductive semiconductor layer, a second conductive semiconductor layer on the active layer, and a semiconductor layer on the second conductive semiconductor layer, and comprising a plurality of a semiconductor structures apart from each other and microfacets.

19 Claims, 14 Drawing Sheets

US 8,106,415 B2

SEMICONDUCTOR LIGHT EMITTING DEVICE

CROSS-REFERENCE TO RELATED APPLICATIONS

The present application claims priority under 35 U.S.C. 126 to Korean Patent Application No. 10-2008-0037444 (filed on Apr. 22, 2008), which is hereby incorporated by reference in its entirety.

BACKGROUND

The present disclosure relates to a semiconductor light emitting device.

Group III-V nitride semiconductors have been variously applied to an optical device such as blue and green Light Emitting Diodes (LED), a high speed switching device such as a Metal Oxide Semiconductor Field Effect Transistor (MOSFET), a High Electron Mobility Transistor (HEMT) and a Hetero junction Field Effect Transistor (HFET), and a light source of a lighting device or a display device.

The nitride semiconductor is mainly used for the LED or a Laser Diode (LD), and studies have been continuously conducted to improve the manufacturing process or light efficiency of the nitride semiconductor.

SUMMARY

Embodiments provide a semiconductor light emitting device comprising a plurality of semiconductor structures which have a concave-convex pattern in their upper portion on a light emitting structure.

Embodiments provide a semiconductor light emitting device comprising a plurality of semiconductor structures which have a plurality of microfacets on a conductive semiconductor layer.

Embodiments provide a semiconductor light emitting device comprising a plurality of semiconductor structures of a horn shape which have a concave-convex pattern in their upper portion, have a plurality of microfacets in an outer side and are spaced apart from each other on a conductive semiconductor layer.

Embodiments provide a semiconductor light emitting device comprising a sub light emitting structure of a horn shape and a first electrode in a mesa etching region.

An embodiment provides a semiconductor light emitting device comprising: a first conductive semiconductor layer; an active layer on the first conductive semiconductor layer; a second conductive semiconductor layer on the active layer; and a semiconductor layer on the second conductive semiconductor layer, and comprising a plurality of a semiconductor structures apart from each other and microfacets.

An embodiment provides a semiconductor light emitting device comprising: a first conductive semiconductor layer; an active layer on the first conductive semiconductor layer; a second conductive semiconductor layer on the active layer; and a semiconductor layer on the second conductive semiconductor layer, and comprising a plurality of a semiconductor structures apart from each other and a concave-convex pattern thereon.

An embodiment provides a semiconductor light emitting device comprising: a light emitting structure comprising a first conductive semiconductor layer, an active layer and a second conductive semiconductor layer; and a semiconductor layer on the light emitting structure, and comprising a plurality of horn-shaped semiconductor structures and a concave-convex pattern thereon.

The details of one or more embodiments are set forth in the accompanying drawings and the description below. Other features will be apparent from the description and drawings, and from the claims.

DETAILED DESCRIPTION OF THE EMBODIMENTS

Reference will now be made in detail to the embodiments of the present disclosure, examples of which are illustrated in the accompanying drawings. In description of embodiments, each element will be described as an example and is not limited to the size of the accompanying drawings.

Figure 1:
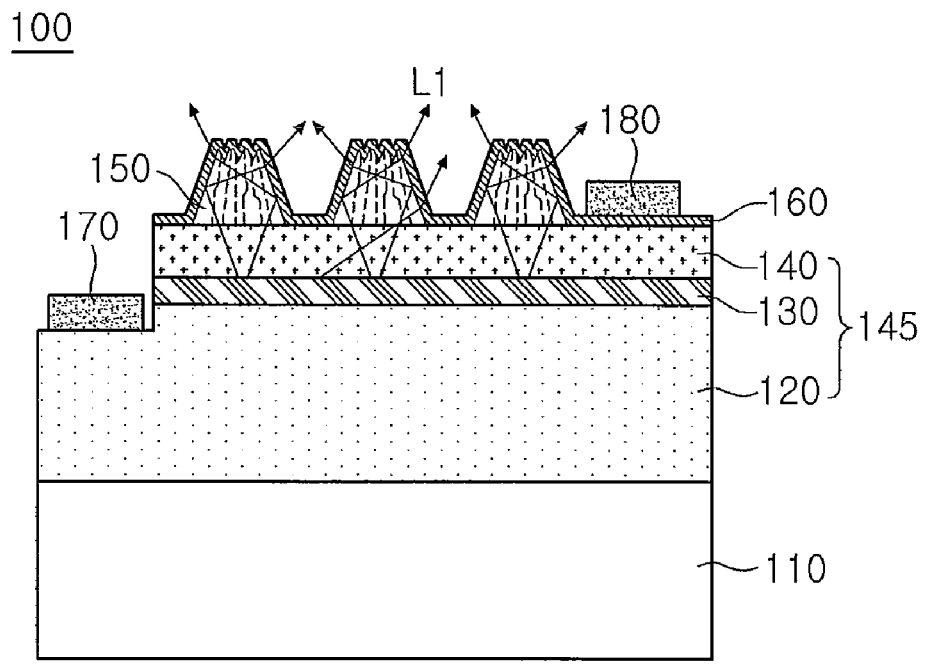
FIG. 1 is a side-sectional view of a semiconductor light emitting device according to a first embodiment.
Figure 2:
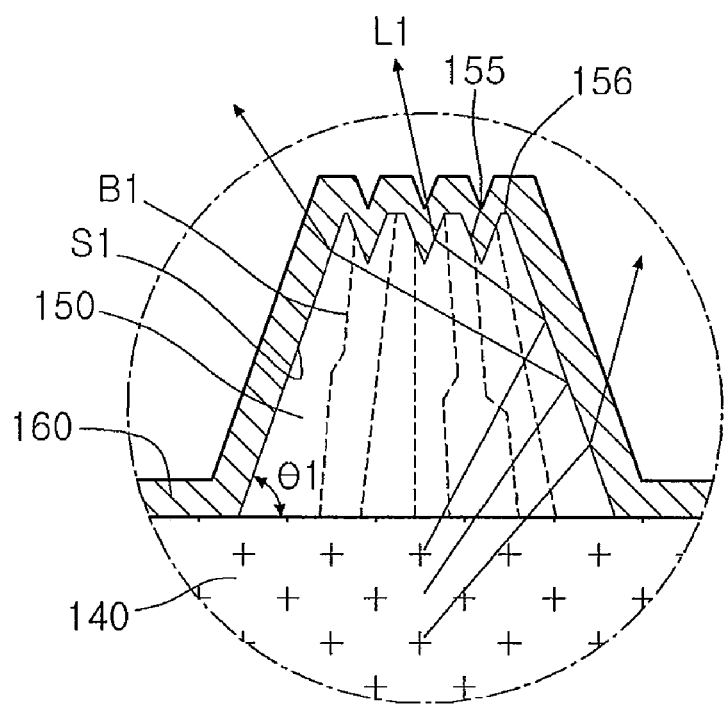
FIG. 2 is an expansion diagram of a third semiconductor structure in FIG. 1.
Figure 3:
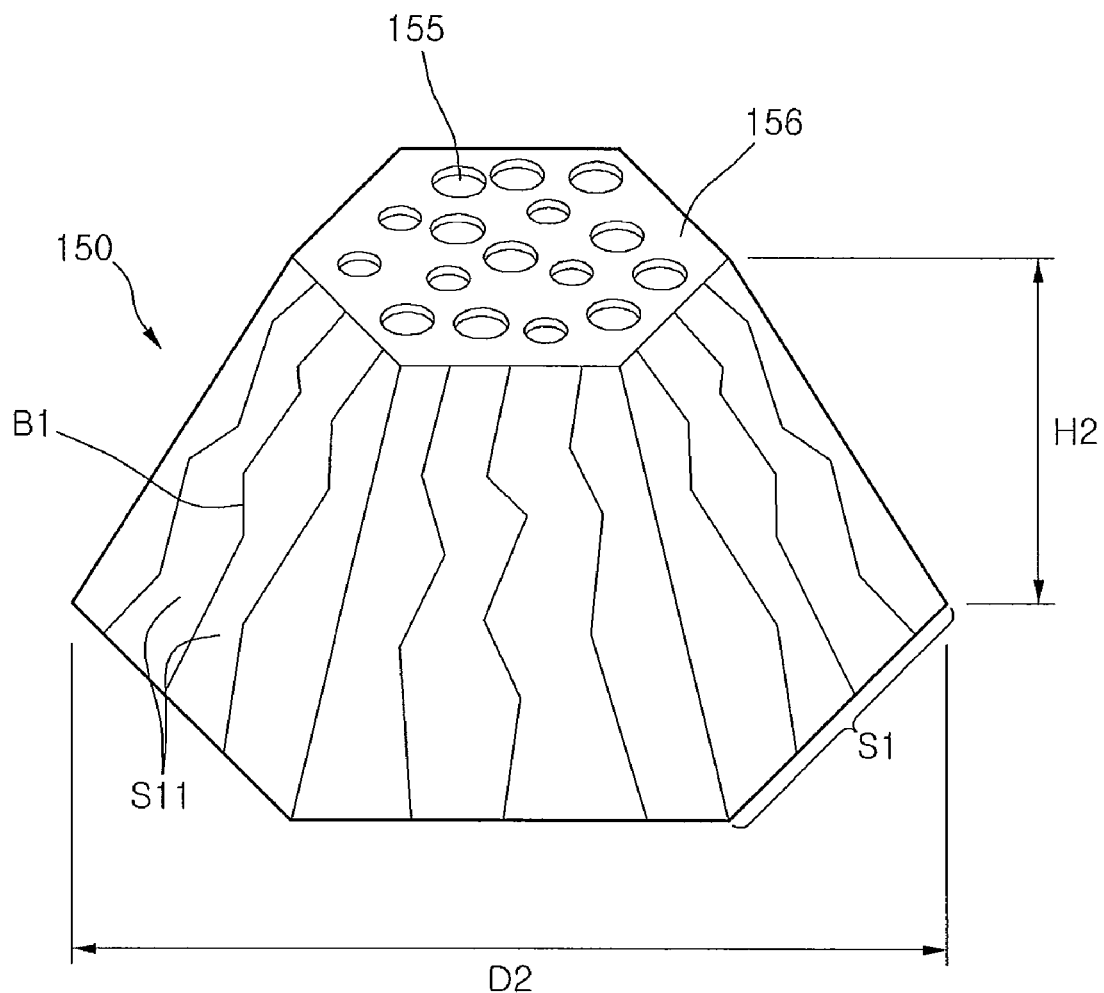
FIG. 3 is a perspective view of a semiconductor structure in FIG. 1.

FIG. 1 is a side-sectional view of a semiconductor light emitting device according to a first embodiment. FIG. 2 is an expansion diagram of a third semiconductor structure in FIG. 1. FIG. 3 is a perspective view of a semiconductor structure in FIG. 1.

Referring to FIG. 1, a semiconductor light emitting device 100 according to the first embodiment comprises a substrate 110, a first conductive semiconductor layer 120, an active layer 130, a second conductive semiconductor layer 140, a horn-shaped third semiconductor structure 150, a transparent electrode layer 160, a first electrode 170, and a second electrode 180.

The substrate 110 may be formed of at least one of sapphire substrate ($Al_2O_3$), GaN, SiC, ZnO, Si, GaP and GaAs. A concave-convex pattern (not shown) may be formed on the top of the substrate 110, and the concave-convex pattern can improve external quantum efficiency. The material and pattern shape of the substrate 110 may be modified within the technical scope of embodiments, but is not limited thereto.

A buffer layer (not shown) or/and an undoped semiconductor layer (not shown) may be formed on the substrate 110. The buffer layer is a layer for decreasing a lattice constant difference with the substrate 110, and may be formed of the group III-V compound semiconductor, for example, GaN, AlN, AlGaN, InGaN, InN, InAlGaN and AlInN.

Moreover, the undoped semiconductor layer may be formed of a GaN-based semiconductor. At least one of the buffer layer and the undoped semiconductor layer is formed on the substrate 110, or both the buffer layer and the undoped semiconductor layer may not be formed on the substrate 110.

At least one first conductive semiconductor layer 120 is formed on the substrate 110. The first conductive semiconductor layer 120 may be formed of at least one of the compound semiconductors of group III-V elements (on which a first conductive dopant is doped), for example, GaN, AlN, AlGaN, InGaN, InN, InAlGaN and AlInN. In a case where the first conductive semiconductor 120 is an N-type semiconductor layer, the first conductive dopant comprises an N-type dopant such as Si, Ge, Sn, Se and Te. The first conductive semiconductor layer 120 may serve as an electrode contact layer, but is not limited thereto.

The active layer 130 is formed on the first conductive semiconductor layer 120, and the active layer 130 may be formed in single quantum well structure or multiple quantum well structure.

The active layer 130 may form the period of a well layer and a barrier layer, for example, the period of an InGaN well layer/GaN barrier layer or the period of an AlGaN well layer/GaN barrier layer by using the compound semiconductor material of group III and group V elements. The active layer 130 may be formed of a material having a bandgap energy according to the wavelength of an emitting light. The active layer 130 may comprise a material emitting a chromatic light such as a light having a blue wavelength, a light having a red wavelength and a light having a green wavelength.

A conductive clad layer may be formed on and/or under the active layer 130, and the conductive clad layer may be formed of an AlGaN-based semiconductor.

At least one second conductive semiconductor layer 140 is formed on the active layer 130, and the second conductive semiconductor layer 140 may be formed of at least one of the compound semiconductors of group III-V elements (on which a second conductive dopant is doped), for example, GaN, AlN, AlGaN, InGaN, InN, InAlGaN and AlInN. In a case where the second conductive semiconductor layer 140 is a P-type semiconductor layer, the second conductive dopant may comprise a P-type dopant such as Mg and Ze. The second conductive semiconductor layer 140 may serve as an electrode contact layer, but is not limited thereto.

Herein, the first conductive semiconductor layer 120, the active layer 130 and the second conductive semiconductor layer 140 may be defined as a light emitting structure 145. The first conductive semiconductor layer 120 may be formed of a P-type semiconductor layer, and the second conductive semiconductor layer 140 may be formed of an N-type semiconductor layer. Moreover, the third conductive semiconductor layer, for example, an N-type semiconductor layer or a P-type semiconductor layer, may be formed on the second conductive semiconductor layer 140. Accordingly, the light emitting structure 145 may comprise at least one of an N-P junction structure, a P-N junction structure, an N-P-N junction structure and a P-N-P structure.

The third semiconductor structures 150 are formed on the upper layer of the light emitting structure 145, for example, the second conductive semiconductor layer 140. The plurality of horn-shaped third semiconductor structures 150 may be formed spaced apart on the second conductive semiconductor layer 140, and may be formed of at least one of group III-V compound semiconductors, for example, GaN, AlGaN, InGaN, InN, AlN and InAlGaN. Herein, the horn shape may comprise a horn shape having a point and a horn shape having no point.

Moreover, the third semiconductor structures 150 may be formed of a conductive semiconductor, on which the first conductive dopant or the second conductive dopant is doped, or an undoped semiconductor on which a conductive dopant is not doped.

The third semiconductor structures 150 may be formed in a shape such as a multi-angle horn, a multi-angle truncated-horn, a cone and a truncated-cone. Moreover, the crystal surface or shape of the third semiconductor structure 150 may be partially modified according to a semiconductor material, a growth condition or an etching degree.

The third semiconductor structures 150 may consist of a single thin layer or a multiple thin layer, and the multiple thin layer may be formed in a multi-heterojunction layer, a supper lattice structure or a Distributed Brag Reflector (DBR) structure. Moreover, the third semiconductor structures 150 may be formed in a single quantum well structure or a multiple quantum well structure.

Herein, in a case where the third semiconductor structure 150 has the DBR structure, the third semiconductor structure 150 is formed in a pair structure where different mediums are stacked, and reflects an incident light having a specific wavelength. Herein, the different mediums may be formed using AlN, GaN, AlGaN, InN, InGaN and InAlGaN.

Referring to FIGS. 2 and 3, the each side S1 of the third semiconductor structure 150 is formed to be inclined at a certain angle ($\theta 1$) with respect to the top of the second conductive semiconductor layer 140. For example, the angle ($\theta 1$) may be formed at about 5° to 85°.

The maximum diameter of the third semiconductor structure 150 is about 0.1 um to 100 um, and the intervals of the convex structures 150 may be formed to be about 0.1 um to 100 um.

The top surface of the third semiconductor structure 150 is formed to have concave-convex pattern 155 and 156. Herein, the top surface of the third semiconductor structure 150 may be formed to have the flat area of a percentage lower than the 90% of their entire area by the concave-convex pattern 155 and 156, thereby improving light extraction efficiency.

A plurality of narrow surfaces S11 may be formed in at least one of all the sides of the third semiconductor structure 150. Herein, the narrow surface may be defined as a microfacet S11.

The plurality of microfacets S11 are formed in a vertical direction at the each side S1 of the third semiconductor structure 150. The microfacet S11 may be formed to a certain position of the each side S1 or may be coupled with other microfacet. Moreover, the boundary region B1 between the microfacets S1 may be formed to overlap. The each side S1 of the third semiconductor structure 150 may be formed to have an irregular size and to be tilted at arbitrary angle with respect to a growth direction (C-axis).

The third semiconductor structure 150 may reflect or transmit light L1 according to its incident angle.

The microfacets S11 and concave-convex pattern 155 and 156 of the third semiconductor structure 150 can increase the diffraction amount of light. That is, the third semiconductor structure 150 can improve light extraction efficiency by the side structure, the concave-convex density of the top and the size of the surface area thereof.

Referring to FIG. 1, the transparent electrode layer 160 may be formed on the third semiconductor structure 150 and the second conductive semiconductor layer 140. The transparent electrode layer 160 may be formed of at least one of ITO, ZnO, RuOx, TiOx and IrOx, but is not limited thereto.

Herein, the concave-convex pattern 155 and 156 of the third semiconductor structure 150 can improve electrical contact efficiency with the transparent electrode layer 160. Accordingly, the amount of current injection and light extraction efficiency can be improved.

The first electrode 170 is formed in a certain region of the first conductive semiconductor layer 120. The second electrode 180 is formed on the transparent electrode layer 160 or/and the second conductive semiconductor layer 140. That is, the second electrode 180 may be formed on the transparent electrode layer 160 or/and the second conductive semiconductor layer 140 in a direct contact type or an indirect contact type. Herein, the transparent electrode layer 160 may not be formed.

The plurality of third semiconductor structures 150 do not have a surface horizontal to the second conductive semiconductor layer 140, and thus, can improve light extraction efficiency.

Light advancing to the third semiconductor structure 150 through the second conductive semiconductor layer 140 may be transmitted, or may be transmitted by being reflected one or more times. The third semiconductor structure 150 is formed of the almost same medium as the semiconductor material of the second conductive semiconductor layer 140, and thus, transmits light incident through the second conductive semiconductor layer 140 or guides the light onto the upper portion thereof in a zigzag type to change the critical angle of the light.

The third semiconductor structure 150 may emit most of incident light to the outside. The third semiconductor structure 150 can decrease the rate in which the light is re-reflected to the inside by a compound semiconductor layer. Accordingly, the light extraction efficiency of the semiconductor light emitting device 100 can be improved.

Moreover, the second conductive semiconductor layer 140 may be formed to have thickness thinner than that of the existing LED Epi structure. Accordingly, most current flows through the flat surface of the transparent electrode layer 160, thereby improving forward voltage drop (Vf) upon driving of the LED.

Table 1 below lists emission angles at which the internal total reflection of light emitted from the each interface of a material constituting a GaN-based LED device is not reached and a portion of the emitted light can be extracted to the outside.

TABLE 1

| | Interface | | |
|---|---|---|---|
| | GaN/air | GaN/epoxy | GaN/ITO |
| Emission angle | 24° | 37° | 57° |

The third semiconductor structure 150 is formed in a structure where the angle ($\theta 1$ in FIG. 2) of its side corresponds to the emission angle, and thus can emit most of light, being incident through the second conductive semiconductor layer 140, to the outside.

FIGS. 4 to 19 are exemplary diagrams illustrating a process for manufacturing the semiconductor light emitting device according to the first embodiment.

Figure 4:
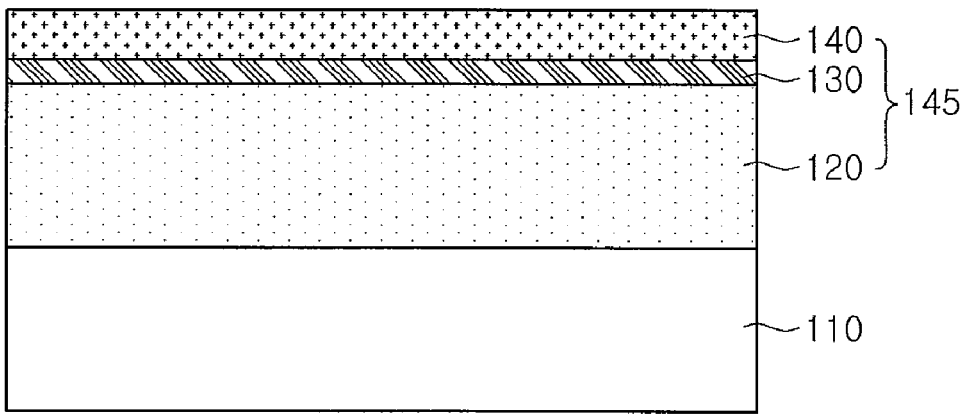
FIGS. 4 to 19 are exemplary diagrams illustrating a process for manufacturing the semiconductor light emitting device according to the first embodiment.
Figure 5:
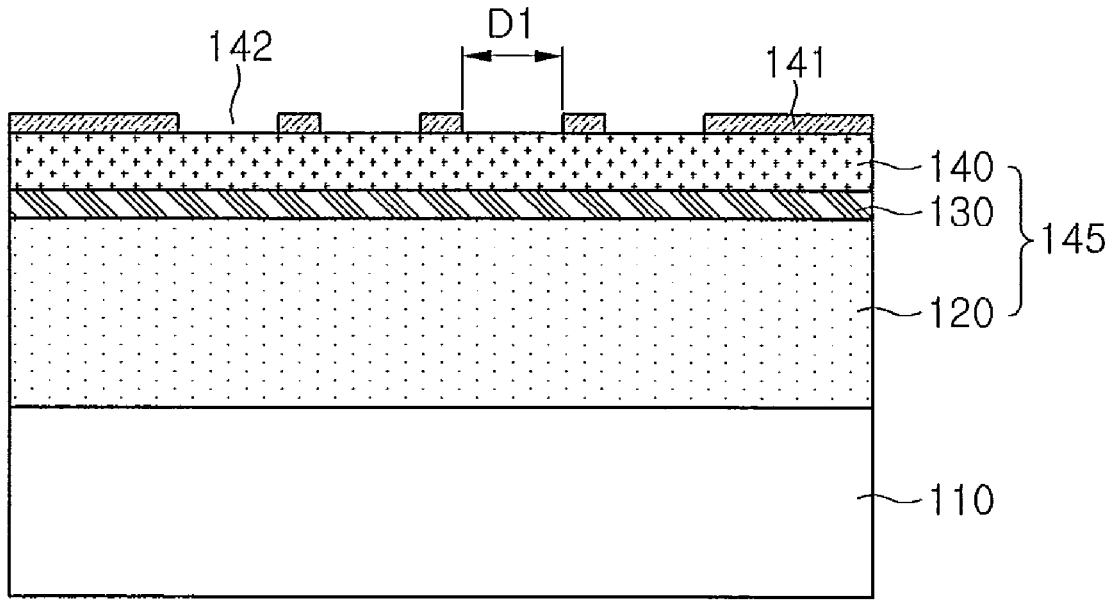

Referring to FIGS. 4 and 5, the light emitting structure 145 is formed on the substrate 110.

The substrate 110 may be selected from the group consisting of sapphire substrate ($Al_2O_3$), GaN, SiC, ZnO, Si, GaP and GaAs. A concave-convex pattern or a roughness structure may be formed on the surface of the substrate 110, but is not limited to thereto.

A nitride semiconductor grows on the substrate 110, and may grow by growth equipment such as electron beam evaporator, Physical Vapor Deposition (PVD), Chemical Vapor Deposition (CVD), Plasma Laser Deposition (PLD), dual-type thermal evaporator, sputtering and Metal Organic Chemical Vapor Deposition (MOCVD), but is not limited thereto.

Other semiconductor layers, for example, a buffer layer (not shown) or/and an undoped semiconductor layer (not shown) may be formed between the substrate 110 and the light emitting structure 145. The buffer layer may be formed of at least one of GaN, AlN, AlGaN, InGaN, InN, InAlGaN and AlInN, and the undoped semiconductor layer may be formed of a GaN type. However, the buffer layer and the undoped semiconductor layer are limited to these embodiments.

The light emitting structure 145 comprises the first conductive semiconductor layer 120, the active layer 130, and the second conductive semiconductor layer 140.

The first conductive semiconductor layer 120 may be formed of at least one of the compound semiconductors of group III-V elements (on which the first conductive dopant is doped), for example, GaN, AlN, AlGaN, InGaN, InN, InAlGaN and AlInN. In a case where the first conductive semiconductor 120 is an N-type semiconductor layer, the first conductive dopant comprises an N-type dopant such as Si, Ge, Sn, Se and Te.

The active layer 130 is formed on the first conductive semiconductor layer 120, and the active layer 130 may be formed in a single quantum well structure or a multiple quantum well structure. The active layer 130 may comprise a material emitting the chromatic light such as a light having a blue wavelength, a light having a red wavelength and a light having a green wavelength. The conductive clad layer may be formed on and/or under the active layer 130, and the conductive clad layer may be formed of an AlGaN-based semiconductor.

At least one second conductive semiconductor layer 140 is formed on the active layer 130, and the second conductive semiconductor layer 140 may be formed of at least one of the compound semiconductors of group III-V elements (on which the second conductive dopant is doped), for example, GaN, AlN, AlGaN, InGaN, InN, InAlGaN and AlInN. In a case where the second conductive semiconductor layer 140 is a P-type semiconductor layer, the second conductive dopant may comprise a P-type dopant such as Mg and Ze.

The third conductive semiconductor layer, for example, an N-type semiconductor layer or a P-type semiconductor layer, may be formed on the second conductive semiconductor layer 140. Accordingly, the light emitting structure 145 may comprise at least one of an N-P junction structure, a P-N junction structure, an N-P-N junction structure and a P-N-P junction structure.

A mask layer 141 is formed on the second conductive semiconductor layer 140. A plurality of holes 142, which are spaced apart from each other, are formed on the mask layer 141. The mask layer 141 may be selected from the group consisting of materials such as $SiO_2$, $SiO_x$, $SiN_2$, $SiN_x$ and $SiO_xN_y$. The holes 142 may have regular intervals or irregular intervals and may be formed in circle or polygon, but is not limited thereto.

The diameters of the holes 142 of the mask layer 141 may be about 1 um to 10 um, and may be varied according to the size of a chip.

Figure 6:
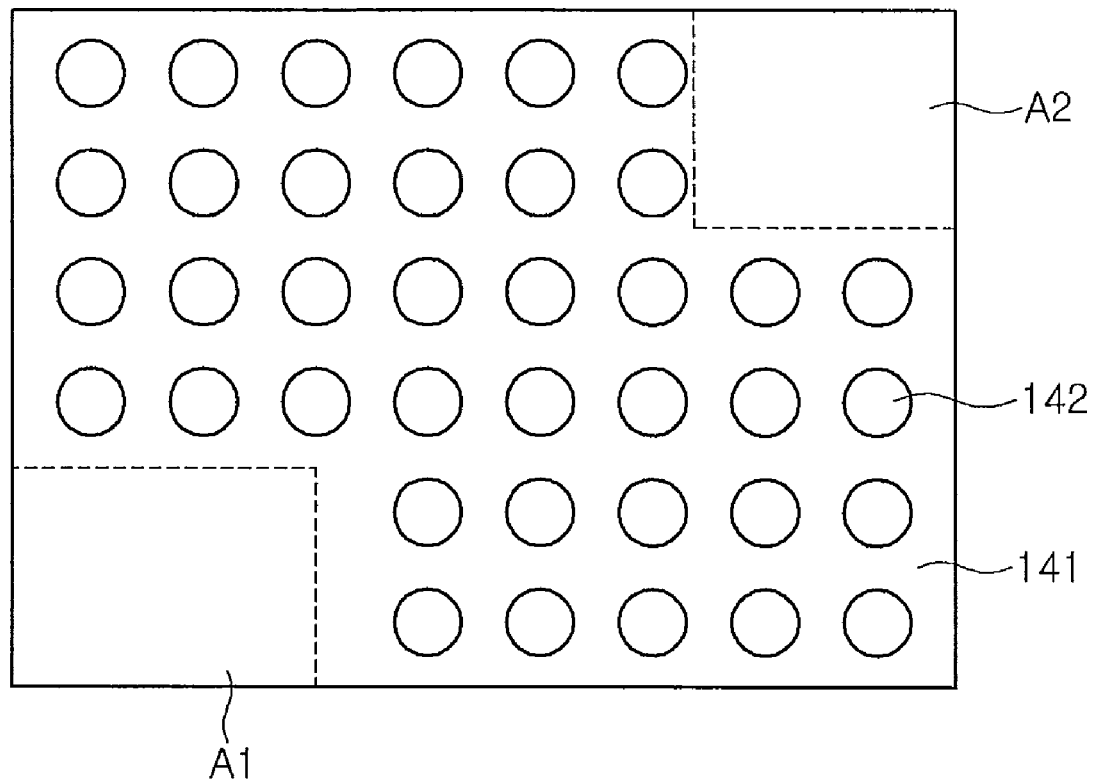

FIG. 6 is a plan view illustrating an example of the mask layer in FIG. 5.

Referring to FIGS. 5 and 6, the holes 142 of the mask layer 141 may be formed in a circle shape spaced a constant interval apart. The holes 142 may not be formed in a mesa etching region A1 and an electrode forming region A2. The mesa etching region A1 and the electrode forming region A2 may be formed in the corner region of each chip or the other region, but is not limited thereto.

The diameters D2 of the holes 142 of the mask layer 141 and intervals between the holes 142 may be equal to or different from one another. Moreover, the disposition structure of the holes 142 may be formed in a matrix type or a zigzag type, but is not limited thereto.

Figure 7:
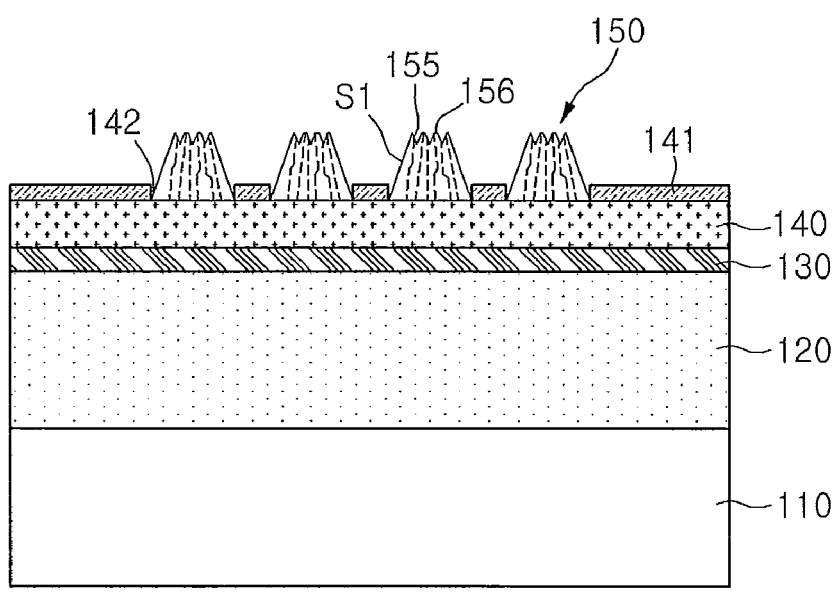
Figure 8:
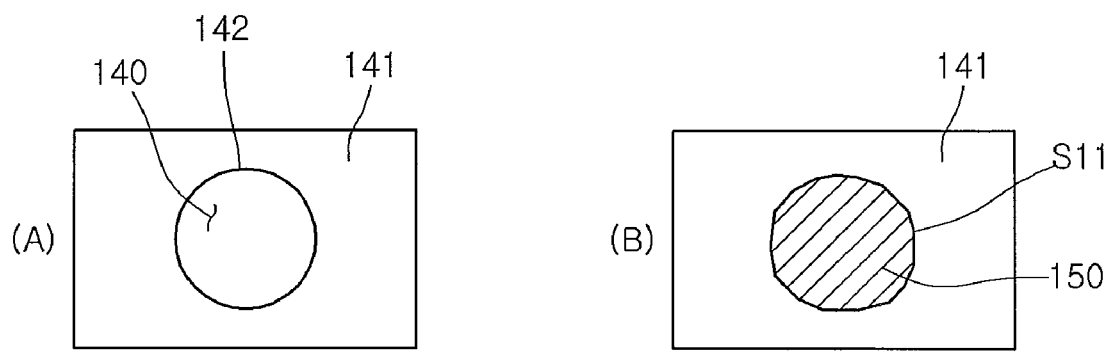

Referring to FIG. 7, the third semiconductor structure 150 is formed on the second conductive semiconductor layer 140 in the holes 142 of the mask layer 141. The third semiconductor structure 150 is formed in a horn shape, and may be formed of at least one of the compound semiconductors of group III-V elements, for example, GaN, AlGaN, InGaN, InN, AlN and AlInN.

The third semiconductor structure 150 may be formed of a P-type semiconductor or an N-type semiconductor on which a first conductive dopant or a second conductive dopant is doped. Moreover, the third semiconductor structure 150 may be formed of an undoped semiconductor on which a conductive dopant is not doped. The material of the third semiconductor structure 150 may be formed in consideration of medium difference or refraction index difference with the second conductive semiconductor layer 140.

In a case where the third semiconductor structure 150 is a P-type GaN, the third semiconductor structure 150 may be formed in a CVD (or MOCVD). For example, the third semiconductor structure 150 may use a group-III gas such as trimethyl gallium (TMGa) or triethyl gallium (TEGa) in a source gas for Ga, may use a group-V gas such as ammonia ($NH_3$), monomethyl hydrazine (MMHy) or dimethyl hydrazine (DMHy) in a source gas for N, and may use $CP_2Mg$ in a source gas for Mg.

The third semiconductor structure 150 may be formed in a desired structure shape (for example, a horn shape) according to growth conditions such as a growth temperature, a group-V gas to group-III gas ratio, and a growth pressure. Upon growth of the third semiconductor structure 150, the first embodiment may selectively use a process of decreasing a growth temperature and a growth pressure and a process of decreasing a group-V gas to group-III gas ratio (for example, $NH_3$/TMGa), in the growth condition of the second conductive semiconductor layer 140. Herein, the growth temperature may decrease to lower than 1000° C., and $N_2$ or/and $H_2$ may be used as an atmosphere gas.

Specifically, the third semiconductor structure 150, for example, may grow using the growth temperature of about 650° C. to 950° C. Such a growth temperature may be changed according to growth equipment, and a vertical growth rate may be changed according to each variable (a temperature, a pressure, and an amount of a gas).

When the third semiconductor structure 150 is a GaN-based semiconductor, it may have a multi-angle horn shape or a cone shape. Herein, the hole 142 of the mask layer 141 has a circle shape, and the third semiconductor structure 150 of the cone shape grows in an atmosphere where nitrogen is more than hydrogen at a low growth temperature.

In the initial stage of the growth of the third semiconductor structure 150, the third semiconductor structure 150 grows in a horizontal direction at a rate lower than in a vertical direction (C-axis) and may be formed in a shape where its upper portion gradually becomes narrower with the elapse of a grown time. At this point, when the area of the top of the third semiconductor structure 150 is smaller than a certain area (for example, 50%), the third semiconductor structure 150 may stop growing.

In the growth condition of the third semiconductor structure 150, when the growth rate of a vertical direction is higher than that of a horizontal direction, the side S1 of the third semiconductor structure 150 may be slopingly formed, and the concave-convex pattern 155 and 156 may be formed on its top.

Herein, the third semiconductor structure 150 may grow in an amorphous structure when it grows at a temperature lower than 500° C., may grow in a multi-crystal structure at a temperature of about 400° C. to 700° C., and may grow in a single crystal structure at a temperature of about 600° C. to 1000° C. The temperature ranges may be changed according to conditions such as growth equipment or growth variables.

The growth rate and type of the convex structure 150 may be changed according to growth equipment, and its vertical growth rate may be changed according to each variable (temperature, pressure and an amount of gas). In the third semiconductor structure 150, the growth conditions in horizontal and vertical directions may be changed according to the diameter and thickness thereof.

The third semiconductor structure 150 does not modify the characteristics of the active layer 130 or the interface of a compound semiconductor layer because of growing at a low growth temperature, thereby preventing the deterioration of electrical and optical characteristics. When the third semiconductor structure 150 grows at a high temperature (for example, 1100° C.), the characteristics of the active layer 130 growing at a low temperature (for example, 700° C. to 800° C.) may be modified, the doping concentration of a semiconductor layer and the interface of each layer may be modified, and the optical and electrical characteristics of an LED may be deteriorated.

FIG. 8A is a plan view illustrating the shape of the hole of the mask layer in FIG. 5. FIG. 8B is a plan view illustrating the horizontal cross-sectional surface of the third semiconductor structure formed in the hole.

Referring to FIGS. 8A and 8B, when the hole 142 of the mask layer 141 has a circle shape, the lower portion of the third semiconductor structure 150 may be formed in a circle shape along the frame of the hole 142, and the plurality of microfacets S11 may be formed around the lower portion.

Figure 9:
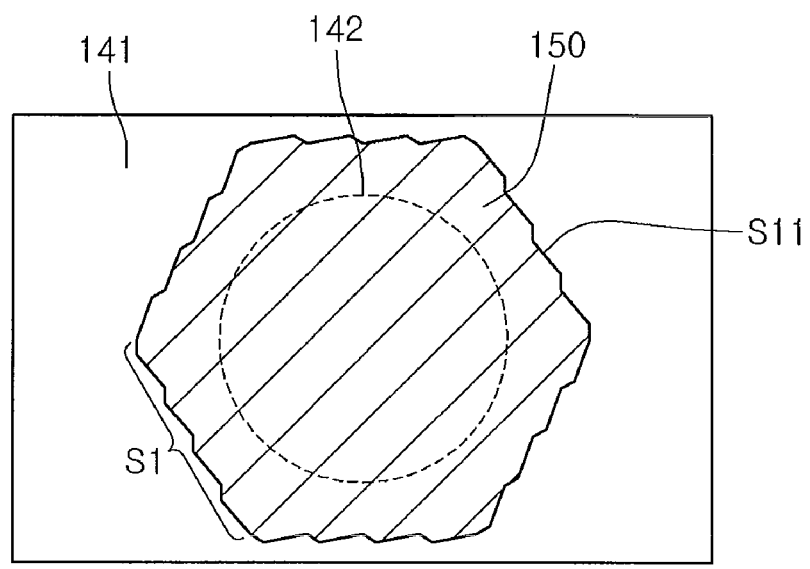
Figure 10:
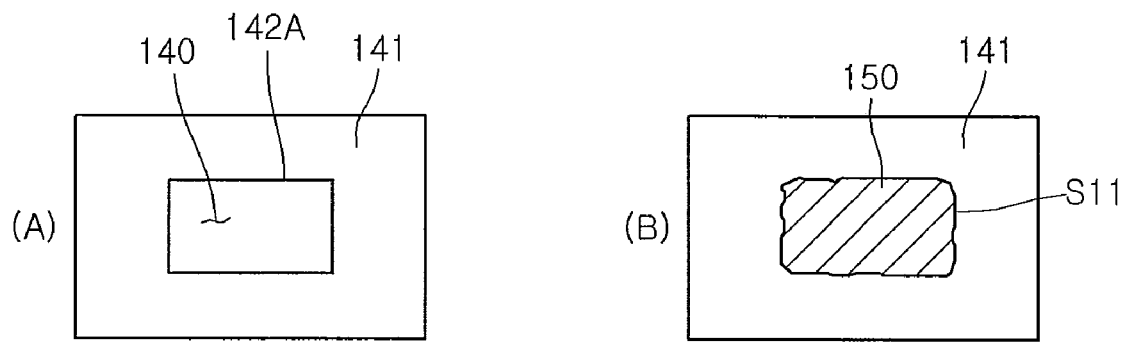
Figure 11:
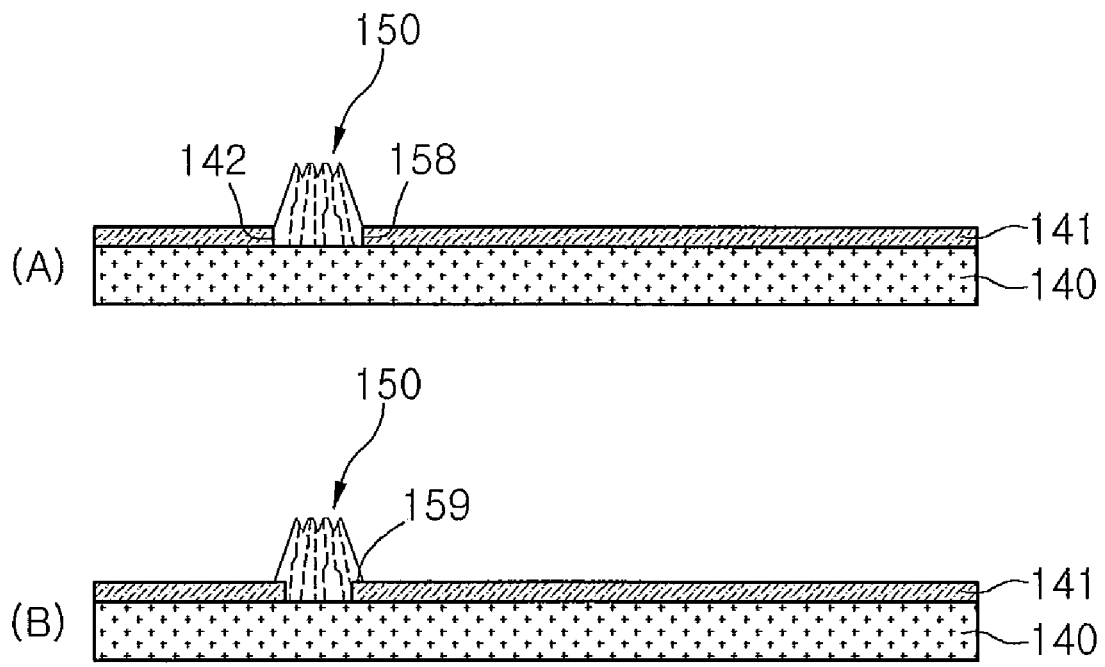

FIG. 9 is a plan view illustrating the horizontal cross-sectional surface of the third semiconductor structure regardless of the shape of the hole of the mask layer.

Referring to FIG. 9, the lower portion of the third semiconductor structure 150 may be formed in a shape having the multi-angle side S1 regardless of the shape of the hole 142 of the mask layer 141, and the plurality of microfacets S11 may be formed around the lower portion.

FIG. 10A is a plan view illustrating the square hole of the mask layer. FIG. 10B is a plan view illustrating the horizontal cross-sectional surface of the third semiconductor structure formed in the hole.

Referring to FIGS. 10A and 10B, when the holes 142A of the mask layer 141 has a square shape, the lower portion of the third semiconductor structure 150 may be formed in a square shape along the frame of the holes 142A, and the plurality of microfacets S11 may be formed around the lower portion.

FIGS. 11A and 11B are plan views illustrating an example of the horizontal cross-sectional surface of the third semiconductor structure.

Referring to FIG. 11A, the lower portion 158 of the third semiconductor structure 150 is formed in the shape of the holes 142 of the mask layer 141. At this point, when the third semiconductor structure 150 grows at a low growth temperature, it may grow at a low rate in a horizontal direction.

Referring to FIG. 11B, the lower portion 159 of the third semiconductor structure 150 may be formed out of the holes 142 of the mask layer 141.

Herein, the lower portion 159 of the third semiconductor structure 150 may be formed in various shapes according to the shape and thickness of the holes 142 of the mask layer 141. The third semiconductor structure 150 may be formed in a horn shape irrespective of the shape of the holes 142 of the mask layer 141.

The third semiconductor structure 150 may be formed without using the mask layer 141, but is not limited thereto.

Figure 12:
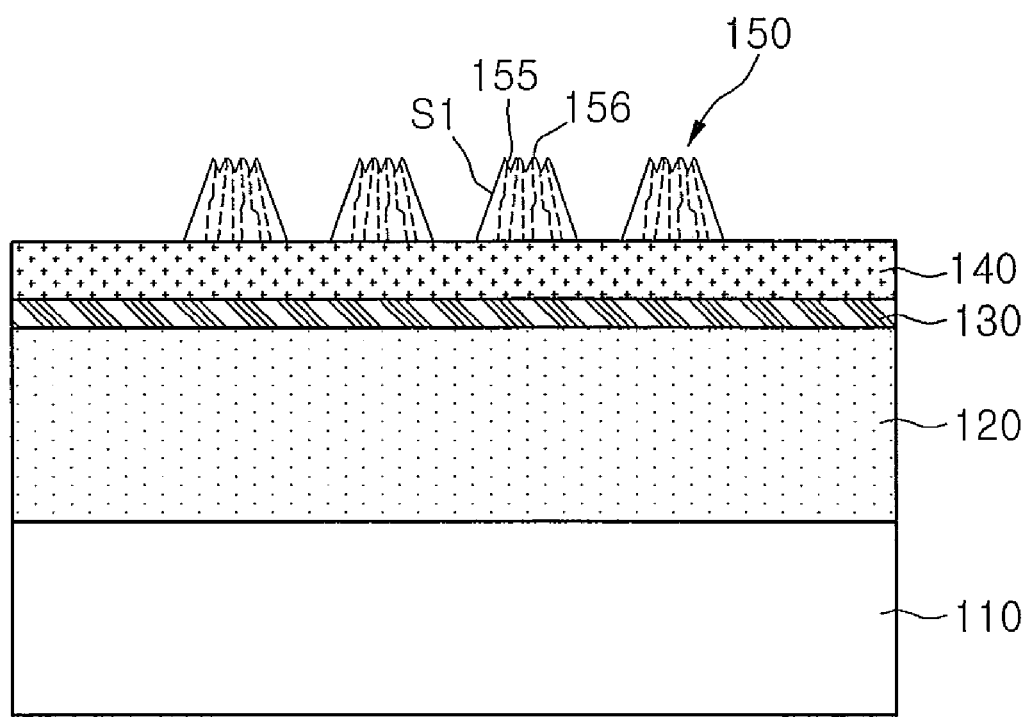
Figure 13:
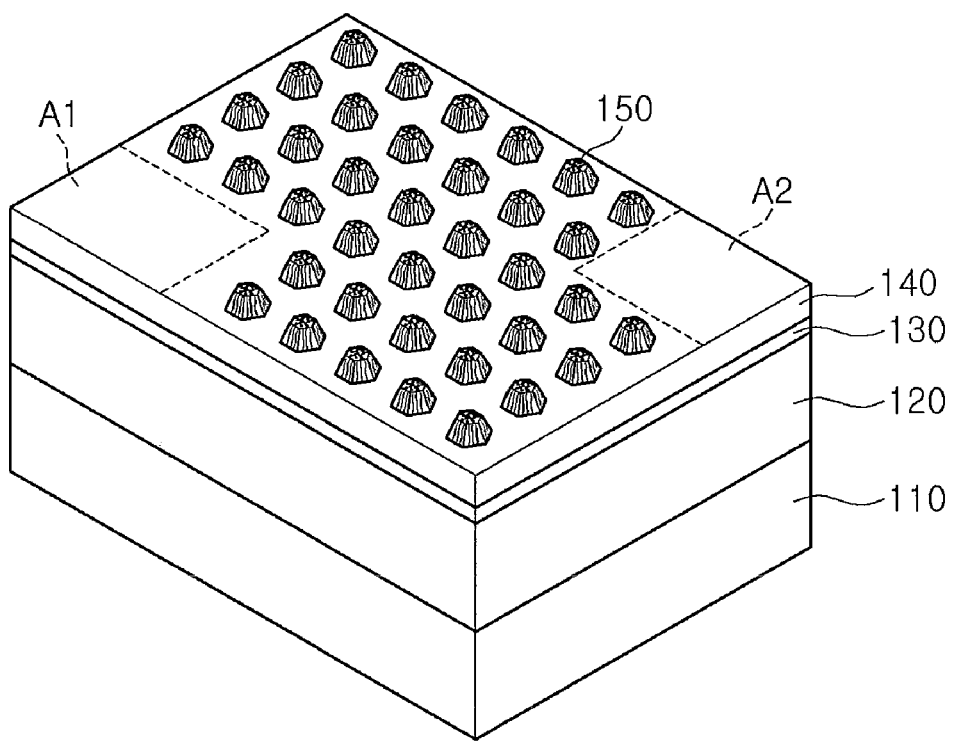

Referring to FIGS. 12 and 13, the mask layer (141 in FIG. 4) is removed on the second conductive semiconductor layer 140, and the plurality of third semiconductor structures 150 are arrayed. The mask layer 141 may be completely or partially removed in an etching process, for example, a wet-etching process. Moreover, when the mask layer has a translucent material, it may not be removed.

The third semiconductor structures 150 are formed in a multi-angle truncated-horn shape having the tilted side S1, and the concave-convex pattern 155 and 156 is formed on their top. The third semiconductor structures 150 may be formed in the multi-angle truncated-horn shape having the tilted side S1 and of the same size or different sizes.

Figure 14:
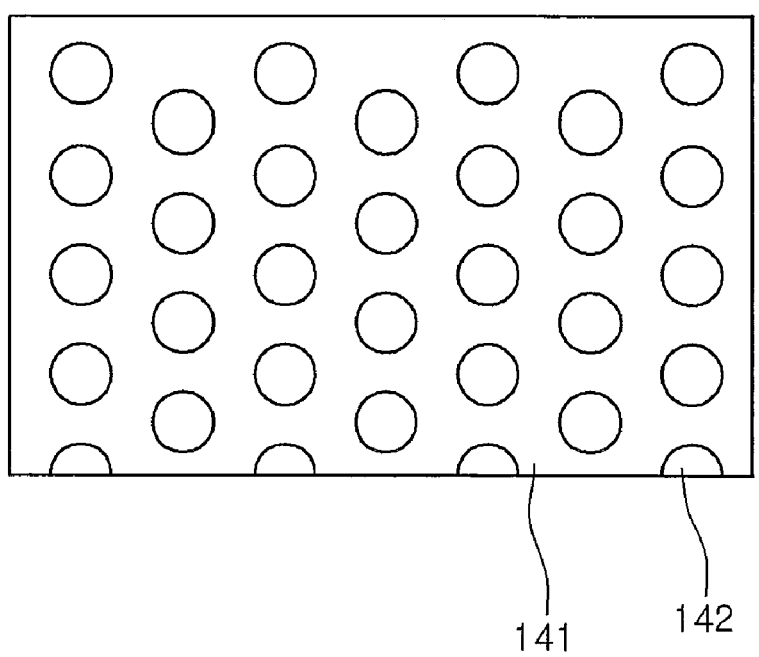
Figure 15:
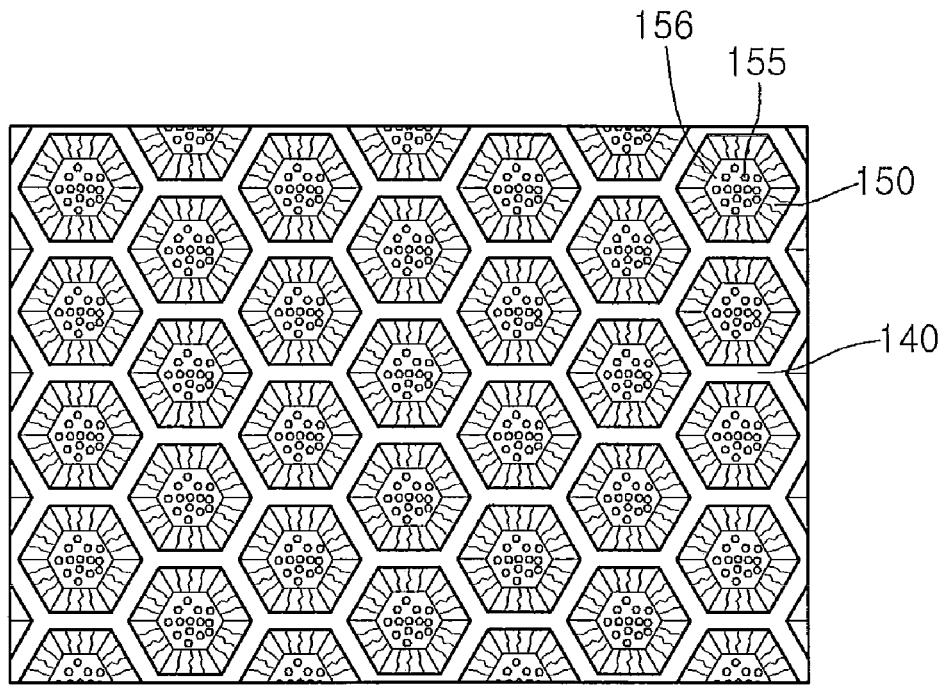

FIGS. 14 and 15 are diagrams illustrating another disposition method of the third semiconductor structure and the hole of the mask layer.

Referring to FIG. 14, the holes 142 may be arranged in a zigzag type at constant intervals over the region of the mask layer 141. In FIG. 15, the plurality of third semiconductor structures 150 may be arranged in the holes 142. The third semiconductor structures 150 may be arranged in a zigzag type or a matrix type with respect to adjacent columns, but is not limited thereto.

Figure 16:
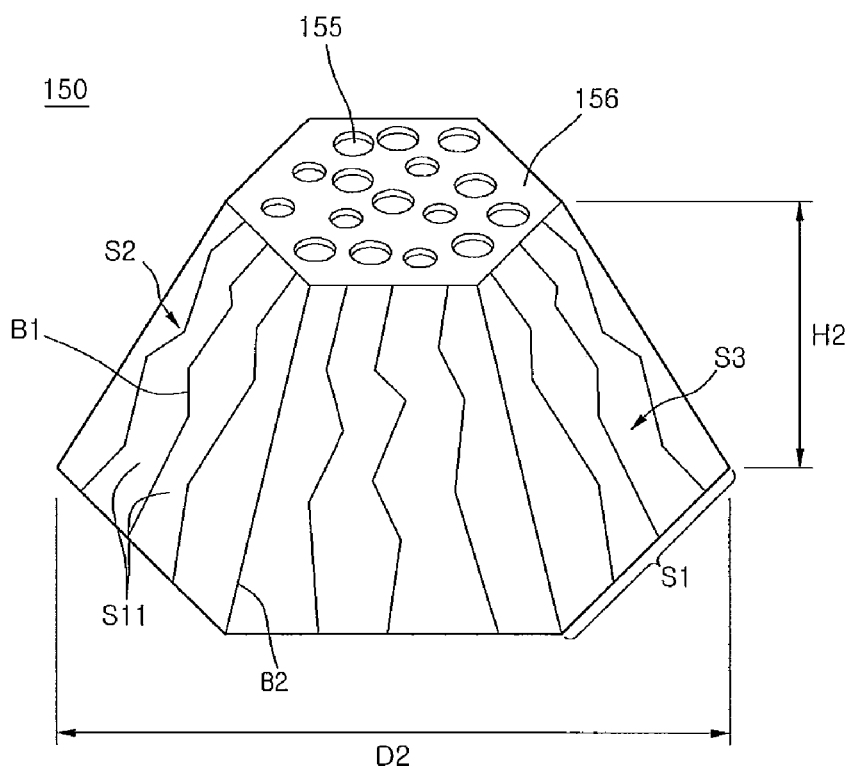
Figure 17:
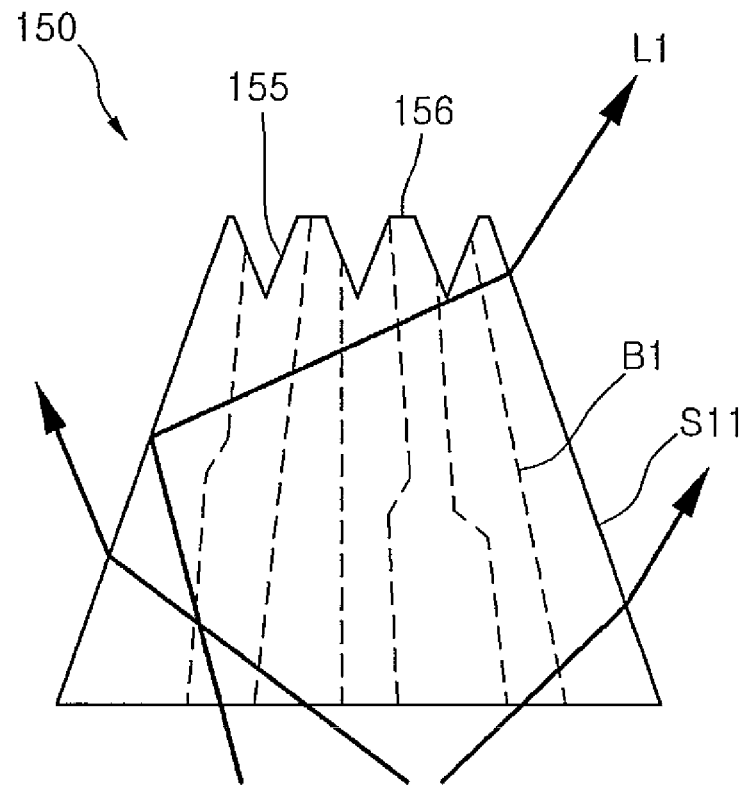

FIG. 16 is a perspective view of the third semiconductor structure. FIG. 17 is a side-sectional view of FIG. 16.

Referring to FIG. 16 and 17, a $1\bar{1}01$ plane S2 and a $11\bar{2}2$ plane S3 which are not horizontal to the semiconductor layer of a light emitting structure are formed on the side S1 of the third semiconductor structure 150, thereby improving external light emission efficiency.

The side S1 of the third semiconductor structure 150 may be formed to have a gentler or steeper surface than a GaN-based crystal surface, and the slope of each side may be formed at about 5° to 85° with respect to the second conductive semiconductor layer. Moreover, the edge portion B2 of the third semiconductor structure 150 may be formed as an angle and may be etched in a curved-surface type.

The concave-convex pattern 155 and 156 is formed on the top of the convex structure 150, and thus, a flat area may be formed to lower than 50% on the top surface. The concave-convex pattern 155 and 156 of the third semiconductor structure 150 can improve light emission efficiency.

A plurality of microfacets S11 may be formed on at least one of the sides S1 of the third semiconductor structure 150. The plurality of microfacets S11 may be sequentially disposed or their boundary region B1 may overlap, and the microfacets may be extended to the upper portion of the third semiconductor structure 150. The microfacets S11 may be inclined or may not be inclined with respect to a vertical direction (C-axis), and may be formed to a random size.

Herein, the maximum diameter D2 of the third semiconductor structure 150 is about 0.1 um to 100 um, its thickness H2 is about 1 um to 100 um, and the interval between the convex structures 150 may be formed to about 0.1 um to 100 um.

Referring to FIG. 17, light incident to the third semiconductor structure 150 is reflected and re-reflected from the side S1, and is emitted to the outside in an angle smaller than a critical angle.

Figure 18:
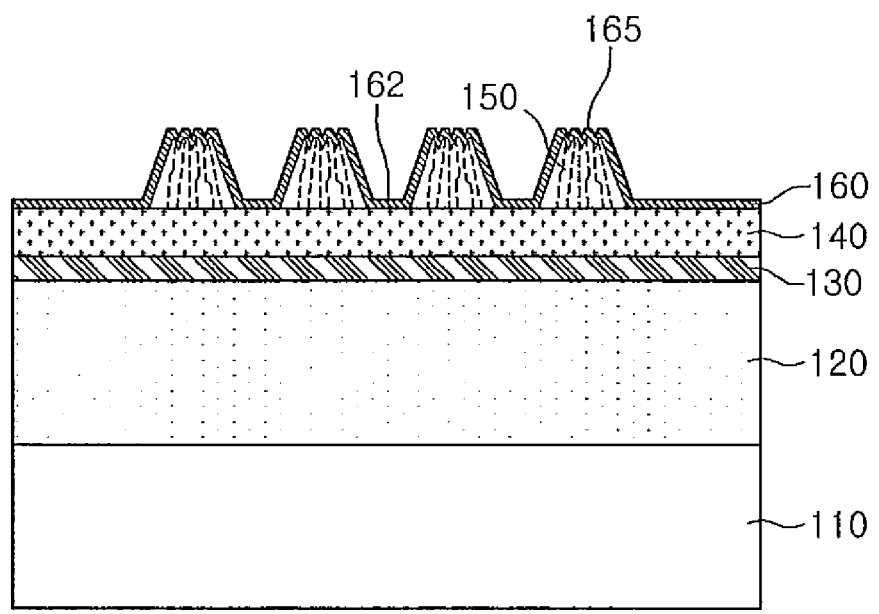

Referring to FIG. 18, the transparent electrode layer 160 may be formed on the second conductive semiconductor layer 140 and the third semiconductor structure 150. The transparent electrode layer 160 may be formed of at least one of ITO, ZnO, RuOx, TiOx and IrOx.

Herein, the transparent electrode layer 160 may be formed in a concave-convex pattern 165 on the third semiconductor structure 150, and may be formed in a flat surface 162 with the second conductive semiconductor layer 140. The transparent electrode layer 160 provides most current through the flat surface 162.

Figure 19:
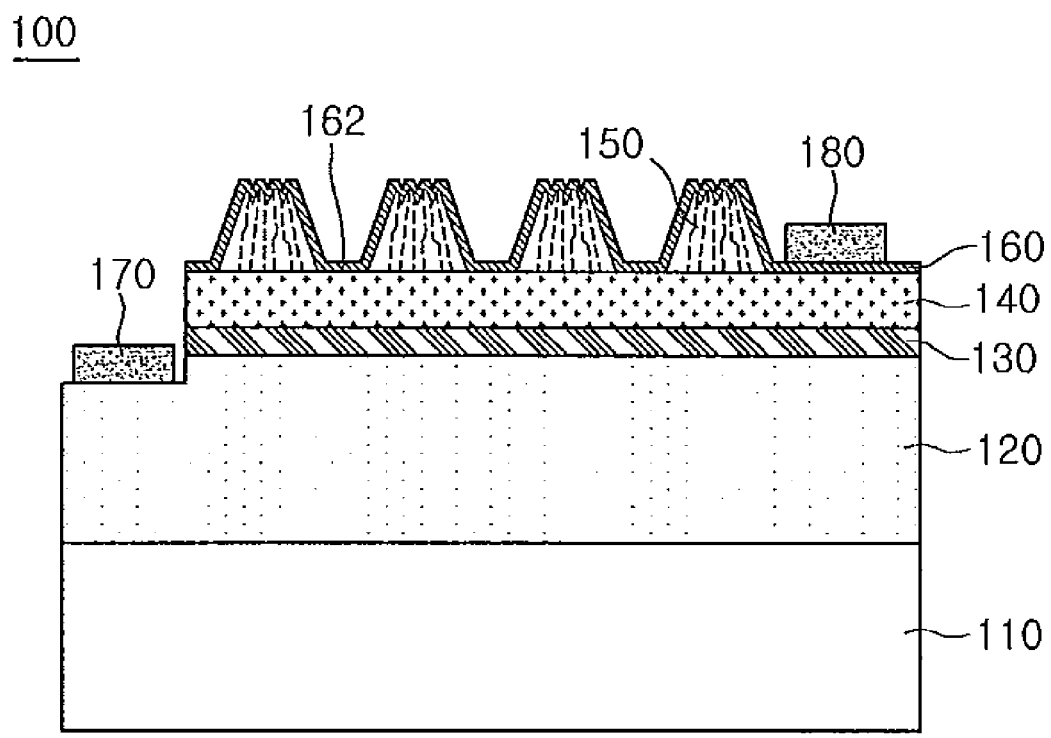

Referring to FIG. 19, when the transparent electrode layer 160 is formed, mesa etching is performed through a mesa etching region to thereby expose a portion of the first conductive semiconductor layer 120. The first electrode 170 is formed on the first conductive semiconductor layer 120, and the second electrode 180 is formed on the transparent electrode layer 160. Herein, the second electrode 180 may be formed on the transparent electrode layer 160 or/and the second conductive semiconductor layer 140.

Light emitted from the active layer 130 is irradiated in a forward direction. At this point, light which is incident to the third semiconductor structure 150 through the second conductive semiconductor layer 140 transmits the third semiconductor structure 150 or is reflected one or more times, and thus, its critical angle may be changed. Accordingly, most of the light incident to the third semiconductor structure 150 may be emitted to the outside.

Herein, in a case where the semiconductor light emitting device 100 is mounted in a flip-chip type, a reflection electrode layer instead of a transparent electrode layer may be formed on the second conductive semiconductor layer 140 and the third semiconductor layer 150. Moreover, the transparent electrode layer may not be formed.

Figure 20:
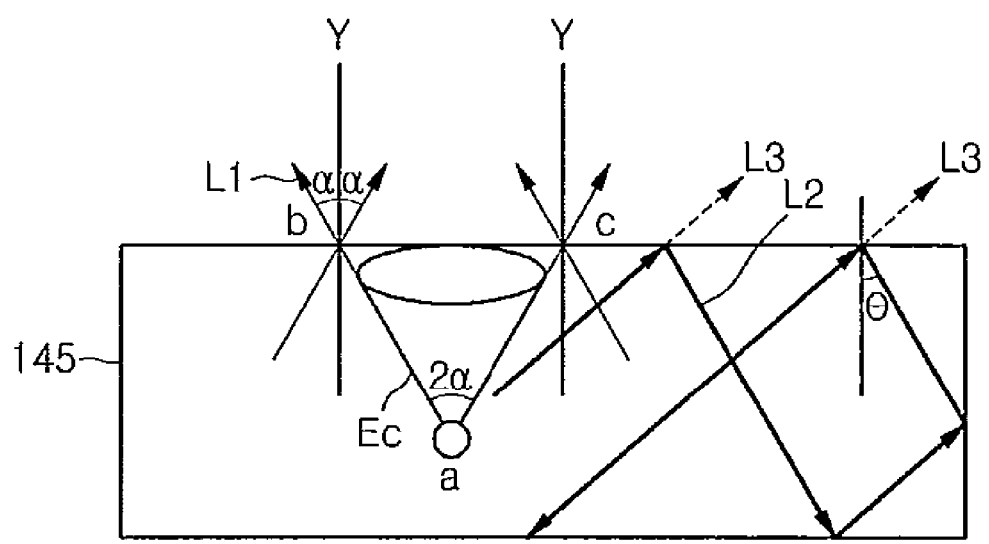
FIG. 20 is a diagram illustrating an internal total reflection critical angle in a light emitting structure according to the first embodiment.

FIG. 20 is a diagram illustrating an internal total reflection critical angle in the light emitting structure according to the first embodiment.

Referring to FIG. 20, light emitted by the active layer 130 of the light emitting structure 145 is radiated in a forward direction. The radiation shape of the light may be represented in the shape of an escape cone (Ec). When the incident angle of light advancing from the light source position (a) of the escape cone structure to the interface positions (b, c) of the semiconductor layer is equal to or larger than the internal total reflection critical angle ($\alpha$) (that is, $\alpha \leq \theta$), light L2 is total reflected in the inside. When the incident angle of the light is smaller than the internal total reflection critical angle ($\alpha$), a portion of light L1 is emitted to the outside and other portion of the light L1 is reflected to the inside.

Herein, the range of the emission angle of the incident light L1 reaches the range of about 20° to 60° in the interface of the semiconductor layer. The emission angle is an angle at which the internal total reflection of light advancing to the interface of the semiconductor layer is not reached and a portion of the light can be extracted to the outside of the semiconductor layer. The interface of the semiconductor layer may be the interface of the second conductive semiconductor layer 140 and the third semiconductor structure 150.

As illustrated in FIGS. 19 and 20, in a case where the second conductive semiconductor layer 140 and the third semiconductor structure 150 are GaN and the transparent electrode layer 160 is ITO, the light emission angle of a GaN/air interface is about 24°, the light emission angle of a GaN/epoxy interface is about 37°, and the light emission angle of GaN/ITO interface is about 57°. Herein, the epoxy represents an example of grease sealing the LED.

Moreover, the side of the third semiconductor structure 150 is formed at an angle corresponding to the emission angle, and may be larger or smaller than the internal angle ($2\alpha$) of the point (a) of the escape cone (Ec).

The third semiconductor structure 150 receives lights L1 and L3 through the second conductive semiconductor layer 140 and most of the received light radiate to the outside, thereby improving light extraction efficiency. Moreover, the horizontal surface is not formed on the third semiconductor structure 150 so that light extraction efficiency can be improved.

Figure 21:
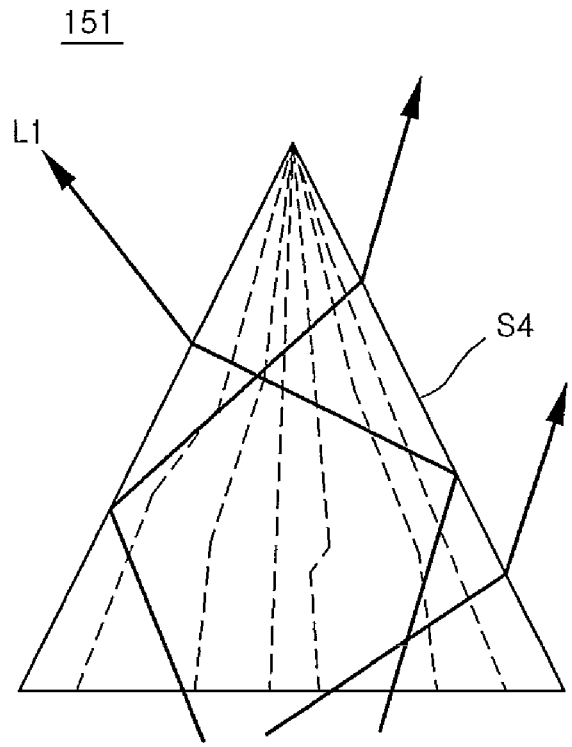
FIG. 21 is a diagram illustrating an example of a third semiconductor structure according to a second embodiment.

FIG. 21 is a diagram illustrating an example of a third semiconductor structure according to a second embodiment. In description of the second embodiment, repetitive description on the same elements as those of the first embodiment will be omitted and refers to that of the first embodiment.

Referring to FIG. 21, a third semiconductor structure 151 is formed in a multi-angle pyramid shape or a multi-angle horn (for example, a six-angle horn) shape having an inclined side and a point, and a plurality of microfacets (not shown) are formed on each side S4. Herein, the internal angle of the point may be formed at an acute angle.

Figure 22:
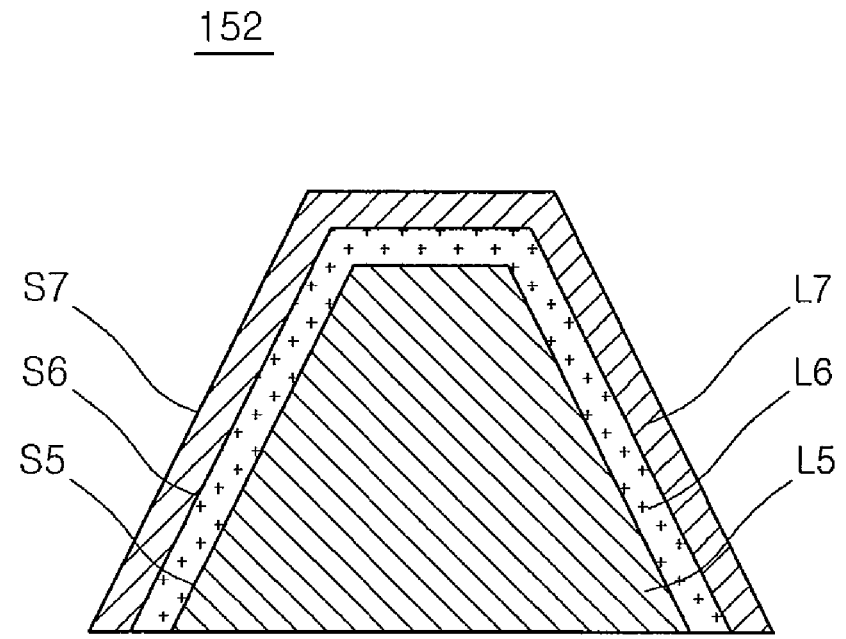
FIG. 22 is a diagram illustrating an example of a third semiconductor structure according to a third embodiment.

FIG. 22 is a diagram illustrating an example of a third semiconductor structure according to a third embodiment. In description of the third embodiment, repetitive description on the same elements as those of the first embodiment will be omitted and refers to that of the first embodiment.

Referring to FIG. 22, a third semiconductor structure 152 may be formed in a horn shape which has multiple layers L5, L6 and L7 and has no edge. A plurality of microfacets (not shown) may be formed on the sides S5, S6 and S7 of the respective layers L5, L6 and L7.

The respective layers L5, L6 and L7 of the third semiconductor structure 152 may be formed of the semiconductor material of different composition, for example, may grow into a DBR layer, a multi-heterojunction layer, a super lattice layer and multiple semiconductor layers having no periodicity. The respective layers L5, L6 and L7 may be formed by selectively using GaN, AlGaN, InGaN, InN, AlN, AlInGaN, translucent materials or conductive metal materials.

The respective layers L5, L6 and L7 are structures where mediums having different refraction indexes are stacked, and, by making the refraction index of an inner layer lower than that of an outer layer (for example, GaN/AlGaN structure), they may be formed for internal light to be easily radiated to the outside. Moreover, the reflection degrees of the respective layers L5, L6 and L7 are made identical, or made to progressively decrease toward the outer layers thereof, thereby enabling internal light to be easily radiated.

Figure 23:
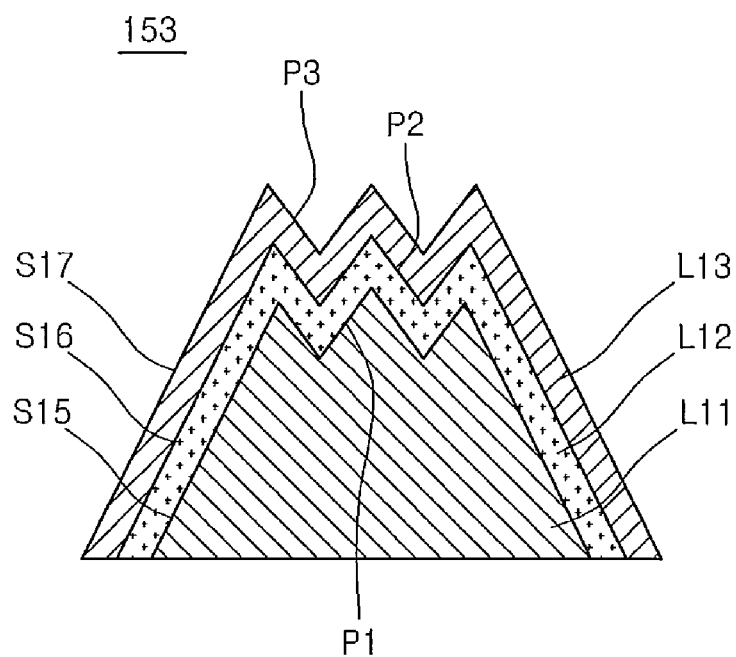
FIG. 23 is a diagram illustrating an example of a third semiconductor structure according to a fourth embodiment.

FIG. 23 is a diagram illustrating an example of a third semiconductor structure according to a fourth embodiment. In description of the fourth embodiment, repetitive description on the same elements as those of the third embodiment will be omitted and refers to that of the third embodiment.

Referring to FIG. 23, a third semiconductor structure 153 may be formed in multiple layers L11, L12 and L13, and has a structure where concave-convex patterns P1, P2 and P3 are formed on its upper portion. A plurality of microfacets (not shown) may be formed on the sides S15, S16 and S17 of the respective layers L11, L12 and L13.

Figure 24:
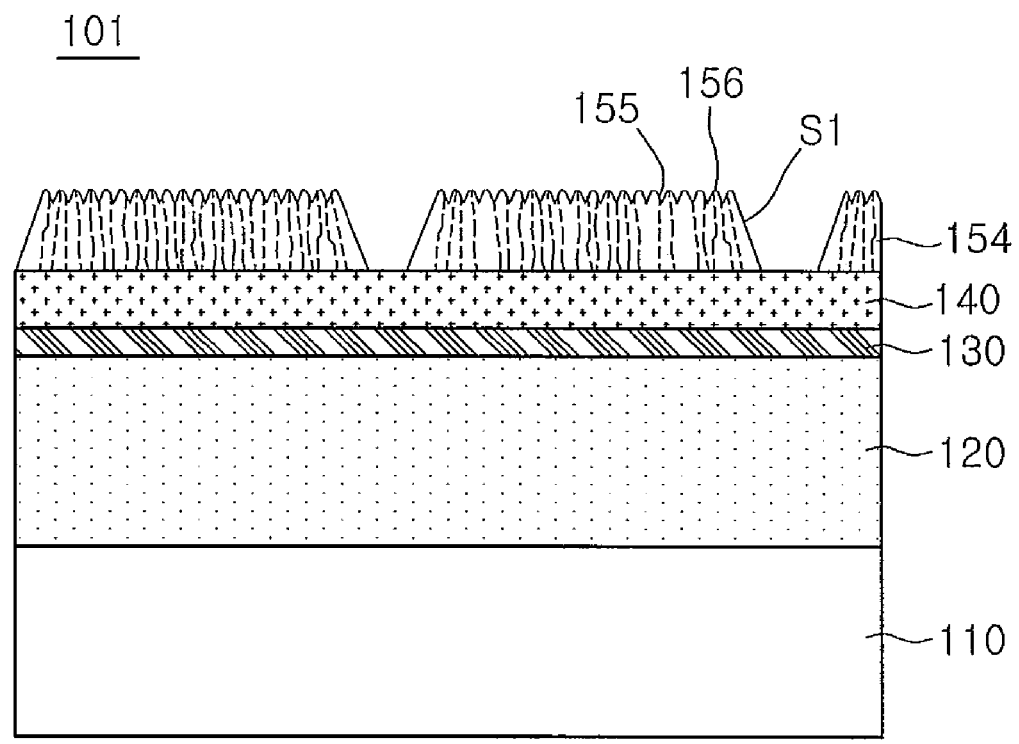
FIG. 24 is a diagram illustrating a semiconductor light emitting device according to a fifth embodiment.

FIG. 24 is a diagram illustrating a semiconductor light emitting device according to a fifth embodiment. In description of the fifth embodiment, repetitive description on the same elements as those of the first embodiment will be omitted and refers to that of the first embodiment.

Referring to FIG. 24, a semiconductor light emitting device 101 according to the fifth embodiment comprises a third semiconductor structure 154 which is formed on the second conductive semiconductor layer 140. The third semiconductor structure 154 is formed by switching the positions of the mask layer 141 and the holes 142 in FIG. 14. The each side S1 of the third semiconductor structure 154 is inclined, and a plurality of microfacets (not shown) may be formed thereon. Moreover, the concave-convex pattern 155 and 156 may be formed on the top of the third semiconductor structure 154.

Figure 25:
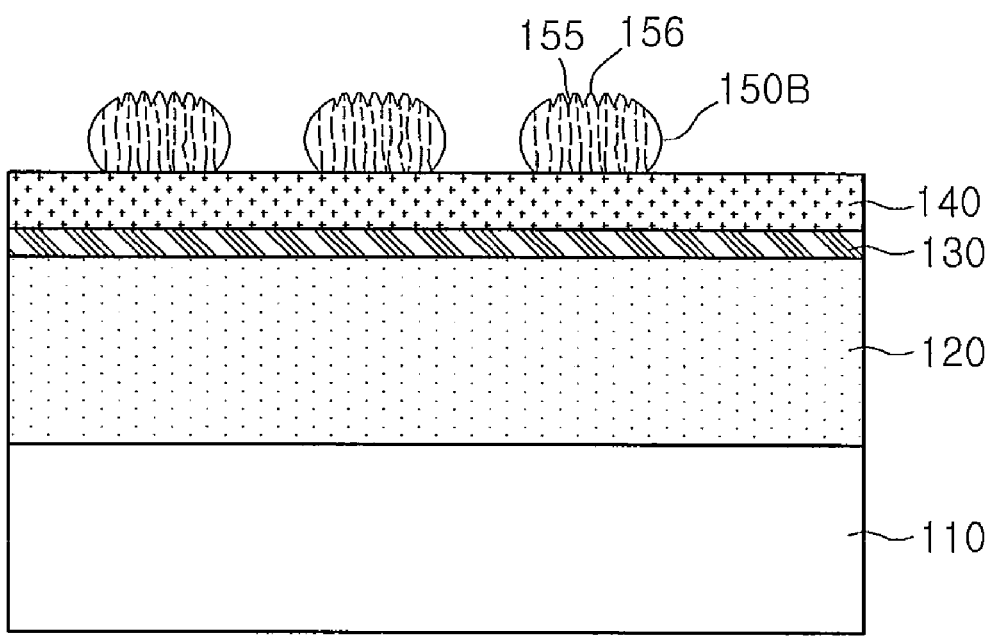
FIG. 25 is a diagram illustrating a semiconductor light emitting device according to a sixth embodiment.

FIG. 25 is a diagram illustrating a semiconductor light emitting device according to a sixth embodiment. In description of the sixth embodiment, repetitive description on the same elements as those of the first embodiment will be omitted and refers to that of the first embodiment.

Referring to FIG. 25, a third semiconductor structure 150B is formed in a domed shape. A plurality of microfacets may be formed on the spherical surface of the third semiconductor structure 150B, and the concave-convex pattern 155 and 156 may be formed on the upper portion of the third semiconductor structure 150B. The third semiconductor structure 150B may grow at a growth temperature of 850° C. or a growth temperature lower than 850° C., and the detailed manufacturing process thereof refers to the first embodiment.

A side of the third semiconductor structure 150B may be inclined at the range of about 10° to 80° from the top of the second conductive semiconductor layer 140. The side of the third semiconductor structure 150B can be formed as the microfacets consisting of the micro plane in a curved-surface type. That is, the side of the third semiconductor structure 150B is the curved surface shape which can be formed a plurality of microfacets or a plurality of fine surfaces. Moreover, the side of the third semiconductor structure 150B can be formed as a shape in which combines with the curved surface and plane. A section of the third semiconductor structure 150B may be formed as circular, and an oval or an irregular shape, and can be changed with the mask pattern.

Figure 26:
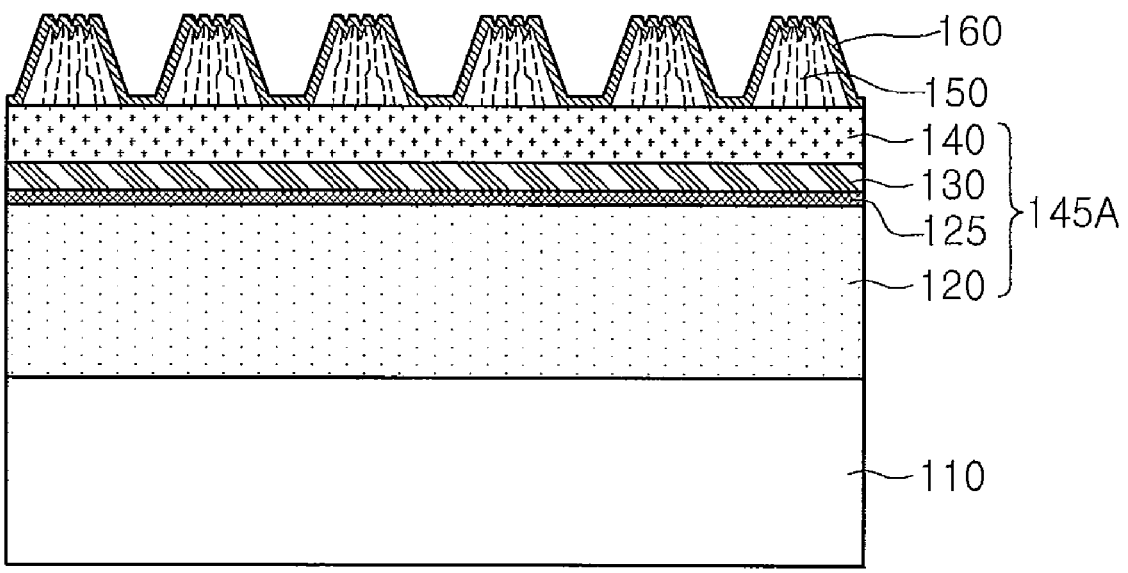
FIGS. 26 and 27 are diagrams illustrating a process of manufacturing a semiconductor light emitting device according to a seventh embodiment.
Figure 27:
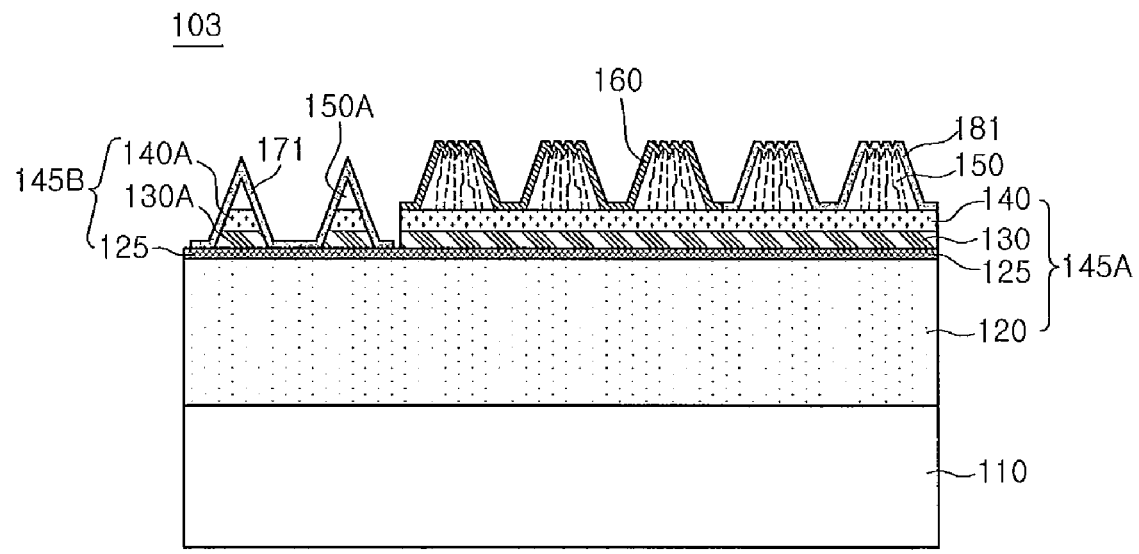

FIGS. 26 and 27 are diagrams illustrating a process of manufacturing a semiconductor light emitting device according to a seventh embodiment. In description of the seventh embodiment, repetitive description on the same elements as those of the first embodiment will be omitted and refers to that of the first embodiment.

Referring to FIG. 26, a light emitting structure 145A comprises the first conductive semiconductor layer 120, a 2Ath conductive semiconductor layer 125, the active layer 130 and the second conductive semiconductor layer 140 which are sequentially stacked.

The 2Ath conductive semiconductor layer 125 may be formed of at least one of the compound semiconductors of group III-V elements (on which a second conductive dopant is doped), for example, GaN, AlN, AlGaN, InGaN, InN, InAlGaN and AlInN. In a case where the 2Ath conductive semiconductor layer 125 is a P-type semiconductor layer, the second conductive dopant comprises a P-type dopant such as Mg and Ze. Herein, the 2Ath conductive semiconductor layer 125 is formed in consideration of the electric characteristics of a forward operation.

The first conductive semiconductor layer 120 may be formed of an N-type semiconductor layer, the second conductive semiconductor layer 140 may be formed of a P-type semiconductor layer, and the third semiconductor structure 150 may be formed of an N-type semiconductor layer (or a P-type semiconductor layer) The conductive characteristics of the semiconductor layer may be formed in an inverse structure.

Referring to FIGS. 26 and 27, mesa etching is performed in a portion of the region of a semiconductor light emitting device 103. Upon mesa etching, the transparent electrode layer 160 existing in the mesa etching region is etched so that it is removed.

A sub third semiconductor layer 150A, a sub second conductive semiconductor layer 140A and a sub active layer 130A are formed in the mesa etching region. The layers 150A, 140A and 130A of the mesa etching region are etched in a state where they have a certain etching difference, and thus are formed in a horn shape.

The etching depth of the mesa etching may be performed until a below portion of the 2Ath conductive semiconductor layer 125 or an upper portion of the first conductive semiconductor layer 120 is exposed. The etching depth of the mesa etching can be changed for characteristic enhancement of the light emitting device.

Herein, the 2Ath conductive semiconductor layer 125, the sub active layer 130A and the sub second conductive semiconductor layer 140A may be defined as a sub light emitting structure 145B. The sub light emitting structure 145B is disposed in a form, for example, an N-P-active layer-P-N structure, where an N-type semiconductor layer and a P-type semiconductor layer exist in the both sides of the sub active layer 130A. The resistance of the sub light emitting structure is designed at a low level, and thus light can be generated through the sub active layer 130A of the mesa etching region, thereby increasing an amount of light emission.

The etching depth of the mesa etching region may be performed until a portion of the 2Ath conductive semiconductor layer 125 or a portion of the first conductive semiconductor layer 120 is exposed. In this case, the two layers 150A and 130A of the mesa etching region are separated from the second conductive semiconductor layer 140 and the active layer 130 in electricity or structure.

Herein, the sub light emitting structure 145B can be formed of the same shape as the third conductive semiconductor structure 150.

A first electrode 170A is formed in the surfaces of the layers 150A, 140A and 130A of the mesa etching region. A second electrode 181 is formed on the second conductive semiconductor layer 140 and the third semiconductor structure 150.

Figure 28:
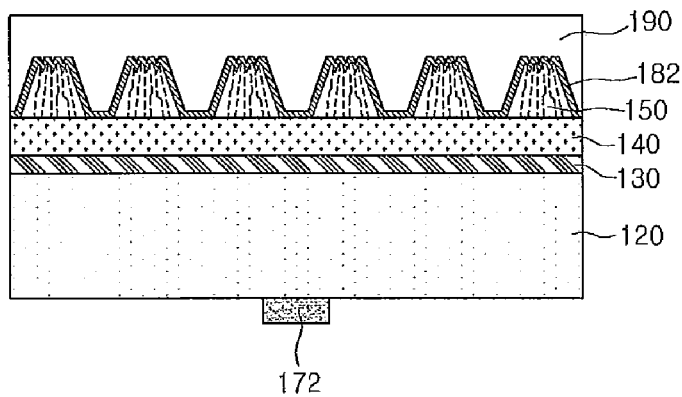
FIG. 28 is a side-sectional view illustrating a semiconductor light emitting device according to a eighth embodiment.

FIG. 28 is a side-sectional view illustrating a semiconductor light emitting device according to a eighth embodiment. In description of the eighth embodiment, repetitive description on the same elements as those of the first embodiment will be omitted and refers to that of the first embodiment.

Referring to FIG. 28, a semiconductor light emitting device 104 according to the eighth embodiment comprises the first conductive semiconductor layer 120, the active layer 130, the second conductive semiconductor layer 140 and the third semiconductor structure 150 which are sequentially stacked on the substrate (110 in FIG. 18).

A second electrode 182 is formed on the second conductive semiconductor layer 140 and the third semiconductor structure 150, and a conductive support member 190 is formed on the second electrode 182.

The second electrode 182 may be formed of a reflection electrode material such as Al, Ag, Pd, Rh, Pt and Ir, and the conductive support member 190 may be formed of a material such as copper, gold and carrier wafer (for example, Si, Ge, GaAs, ZnO, SiC and the like).

Subsequently, the substrate (110 in FIG. 18) is removed by a physical or/and chemical process. The substrate (110 in FIG. 10) may be removed by a Laser Lift Off (LLO) process being the physical removing process, and the chemical removing process may remove the substrate with a wet-etching solution. However, the removing process of the substrate is not limited to this embodiment. The first electrode 172 is formed under the first conductive semiconductor layer 120.

The technical characteristics of the above-disclosed first to eighth embodiments are not limited to the each embodiment, and can be applied to another embodiment.

Although the embodiment has been made in relation to the compound semiconductor light emitting device comprising the N-P junction structure as an example, the compound semiconductor light emitting device comprising an N-P-N structure, a P-N structure or a P-N-P structure can be implemented. In the description of the embodiment, it will be understood that, when a layer (or film), a region, a pattern, or a structure is referred to as being "on (above/over/upper)" or "under (below/down/lower)" another substrate, another layer (or film), another region, another pad, or another pattern, it can be directly on the other substrate, layer (or film), region, pad or pattern, or intervening layers may also be present. Furthermore, it will be understood that, when a layer (or film), a region, a pattern, a pad, or a structure is referred to as being "between" two layers (or films), regions, pads or patterns, it can be the only layer between the two layers (or films), regions, pads, or patterns or one or more intervening layers may also be present. Thus, it should be determined by technical idea of the invention.

Any reference in this specification to "one embodiment," "an embodiment," "example embodiment," etc., means that a particular feature, structure, or characteristic described in connection with the embodiment is comprised in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A semiconductor light emitting device, comprising:
a first conductive semiconductor layer;
an active layer on the first conductive semiconductor layer;
a second conductive semiconductor layer on the active layer;

a plurality of semiconductor structures apart from each other on the second conductive semiconductor layer; and a first electrode layer on the plurality of semiconductor structures, wherein at least one of the plurality of semiconductor structures includes a bottom surface facing the second conductive semiconductor layer, a top surface having a concave-convex pattern opposite the bottom surface and a plurality of side surfaces, an area of the bottom surface being larger than the top surface, wherein at least one of the plurality of side surfaces includes a plurality of microfacets, and wherein the plurality of semiconductor structures has structural differences from the second conductive semiconductor layer such that the plurality of semiconductor structures is distinguishable from the second conductive semiconductor layer.

2. The semiconductor light emitting device according to claim 1, wherein the plurality of semiconductor structures comprises at least one of multi-angle truncated-horn shape, a multi-angle horn shape and a domed shape where a plurality of microfacets are formed in each of the side surfaces.

3. The semiconductor light emitting device according to claim 1, wherein the plurality of semiconductor structures comprises a concave-convex pattern.

4. The semiconductor light emitting device according to claim 1, wherein the plurality of semiconductor structures comprises at least one selected from the group of GaN, InN, AlN, InGaN, AlGaN and InAlGaN.

5. The semiconductor light emitting device according to claim 1, wherein the plurality of semiconductor structures comprises at least one of an N-type semiconductor, a P-type semiconductor and an undoped semiconductor.

6. The semiconductor light emitting device according to claim 1, wherein the first electrode comprises at least one of a transparent electrode, a reflection electrode, and a conductive semiconductor layer on the plurality of semiconductor structures and the second conductive semiconductor layer.

7. The semiconductor light emitting device according to claim 1, wherein the plurality of semiconductor structures includes multiple layers.

8. The semiconductor light emitting device according to claim 1, comprising at least one of a second electrode and a sub light emitting structure in a region of the first conductive semiconductor layer.

9. The semiconductor light emitting device according to claim 8, wherein the sub light emitting structure comprises:

a sub semiconductor layer on the first conductive semiconductor layer;

a sub active layer separated from the active layer on the sub semiconductor layer;

a sub second conductive semiconductor layer separated from the second conductive semiconductor layer on the sub active layer.

10. The semiconductor light emitting device according to claim 1, wherein each side surface of the plurality of semiconductor structures is formed to be inclined at about 5° to 85° with respect to the second conductive semiconductor layer.

11. A semiconductor light emitting device, comprising:

a first conductive semiconductor layer;

an active layer on the first conductive semiconductor layer;

a second conductive semiconductor layer on the active layer;

a plurality of semiconductor structures apart from each other on the second conductive semiconductor layer; and an electrode layer on the plurality of semiconductor structures, wherein at least one of the plurality of the semiconductor structures includes an upper surface having a concave-convex pattern and a side surface, and wherein the plurality of semiconductor structures has structural differences from the second conductive semiconductor layer such that the plurality of semiconductor structures is distinguishable from the second conductive semiconductor layer.

12. The semiconductor light emitting device according to claim 11, wherein the plurality of semiconductor structures includes at least one of a multi-angle horn shape, a multi-angle truncated-horn shape, a cone shape, a truncated-cone shape and a domed shape.

13. The semiconductor light emitting device according to claim 11, wherein at least one of intervals, heights and maximum diameters of the plurality of semiconductor structures are formed to about 0.1 μm to 100 μm.

14. The semiconductor light emitting device according to claim 11, wherein the plurality of semiconductor structures comprises a multi-heterojunction layer, a Distributed Brag Reflector (DBR) structure, a quantum well structure or a super lattice structure where a plurality of semiconductors are stacked.

15. The semiconductor light emitting device according to claim 11, further comprising a flat surface where the semiconductor structures are not formed on the second conductive semiconductor, wherein a percentage of area of the flat surface to a total area of the second conductive semiconductor layer is lower than 90%.

16. The semiconductor light emitting device according to claim 11, wherein the plurality of semiconductor structures has a horn shape, and has the same medium as the second conductive semiconductor layer.

17. The semiconductor light emitting device according to claim 11, wherein the light emitting structure comprises an N-type semiconductor layer or a P-type semiconductor layer on the second conductive semiconductor layer, and comprises at least one of an undoped semiconductor layer, a buffer layer, a substrate and a first electrode under the first conductive semiconductor layer.

18. The semiconductor light emitting device according to claim 11, wherein the second conductive semiconductor layer and the plurality of semiconductor structures comprise a group III-V compound semiconductor.

19. The semiconductor light emitting device according to claim 11, wherein at least one of the plurality of the semiconductor structures has a horn shape.

* * * * *